(12) United States Patent
Wolf

(10) Patent No.: US 6,542,559 B1
(45) Date of Patent: Apr. 1, 2003

(54) DECODING METHOD AND APPARATUS

(75) Inventor: Jack K. Wolf, La Jolla, CA (US)

(73) Assignee: Qualcomm, Incorporated, San Diego, CA (US)

(*) Notice: Subject to any disclaimer, the term of this patent is extended or adjusted under 35 U.S.C. 154(b) by 0 days.

(21) Appl. No.: 09/571,066

(22) Filed: May 15, 2000

(51) Int. Cl.[7] ............................ H04L 27/06; H04L 7/02; H03M 13/03

(52) U.S. Cl. ...................... 375/340; 375/360; 314/788

(58) Field of Search ................................ 375/340, 360, 375/362; 371/43, 45; 714/788; 314/788

(56) References Cited

U.S. PATENT DOCUMENTS

| | | | | |
|---|---|---|---|---|
| 4,881,241 A | * | 11/1989 | Pommier et al. | 375/260 |
| 4,998,253 A | * | 3/1991 | Ohashi et al. | 371/43 |
| 5,233,629 A | * | 8/1993 | Paik et al. | 375/262 |
| 5,446,747 A | * | 8/1995 | Berrou | 371/45 |
| 5,577,053 A | * | 11/1996 | Dent | 371/37.4 |
| 5,721,745 A | * | 2/1998 | Hladik et al. | 371/43 |
| 5,729,560 A | * | 3/1998 | Hagenauer et al. | 371/43.1 |
| 5,734,962 A | * | 3/1998 | Hladik et al. | 455/12.1 |
| 6,014,411 A | * | 1/2000 | Wang | 375/259 |
| 6,023,783 A | * | 2/2000 | Divsalar et al. | 714/792 |
| 6,028,899 A | * | 2/2000 | Petersen | 375/341 |
| 6,173,016 B1 | * | 1/2001 | Suzuki | 375/295 |
| 6,308,294 B1 | * | 10/2001 | Ghosh et al. | 741/751 |

OTHER PUBLICATIONS

Bendetto, et al. "Iterative Decoding of Serially Concatenated Codes with Interleavers and Comparison with Turbo Codes" IEEE Global Telecommunications Conference 2:654–658 (Nov. 1997).

Hsu, et al. "A Parallel Decoding Scheme for Turbo Codes" Proceedings of the 1998 IEEE International Symposium on Circuits and Systems 1:445–448 (May 1998).

* cited by examiner

*Primary Examiner*—Chi Pham
*Assistant Examiner*—Tony Al-Beshrawi
(74) *Attorney, Agent, or Firm*—Philip R. Wadsworth; Kent D. Baker; S. Hossain Beladi

(57) ABSTRACT

A decoding method and apparatus include providing capability for decoding data symbols that were encoded in a transmitter by either a serial-concatenated code or turbo code in a parallel processing fashion. The receiver upon knowing the encoding method may reconfigure the selection of data symbols from a table (600) to accommodate the appropriate decoding process. Initially a data symbol estimate for a number of data symbols of a plurality of data symbols $X_i$, $Y_i$, and $W_i$ are determined. The estimates of data symbols $X_i$, $Y_i$, and $W_i$ passing to a first and second decision nodes (610, 620) include estimates for the variables in one or more encoding equations. A new estimate for the data symbol $X_i$ is determined based on the estimate determined at the initial step and the new estimate for each occurrence of the data symbol $X_i$ at the first and second decision nodes (610, 620). After normalizing estimates of data symbols $X_i$, $Y_i$, and $W_i$, a new estimate for data symbol $X_i$ may be determined which holds more confidently a true value for the data symbol $X_i$ than a previously determined estimate.

8 Claims, 7 Drawing Sheets

DECODING METHOD AND APPARATUS

BACKGROUND OF THE INVENTION

The present invention generally relates to communication systems, and more particularly, a code division multiple access (CDMA) communication system. The invention provides an efficient method and apparatus for decoding data symbols in a receiver portion of a CDMA communication system.

Communications in a CDMA system involve coding and decoding data symbols at different stages. Data symbols, for transmission to a destination user, are encoded in a transmitter portion of the CDMA system before being transmitted over a communication link, such as a wireless link. Upon receiving the transmitted signal, the destination user decodes the data symbols to retrieve the information. A convolutional code is a very popular code used for the encoding operation. To achieve an effective communication between users, in addition to coding, data symbols are interleaved. A destination user in the process of receiving the information decodes and de-interleaves the received data symbols to retrieve the information. The combination of interleaving and convolutional coding provides a more effective way of dealing with channel disturbances, for example, due to noise, fading or interference from other users in a communication system, such as a CDMA system.

A combination of coding and interleaving commonly known as a turbo code performed in a transmitter of a CDMA communication system has shown to provide superior results in ways of dealing with channel disturbances. A combination of coding and interleaving commonly known as a serial-concatenated code (SCC) has shown also to provide superior results. As such, a CDMA system may use either a turbo code or an SCC.

Generally speaking, a turbo code and a serial-concatenated code each include at least two encoding blocks. As such, a receiver attempting to decode the received data symbols may have to deal with two decoding operations. Multiple decoding operations in a receiver takes time and adds complexity and cost to the receiver portion of the CDMA systems.

Several differences exist between turbo and serial-concatenated codes. A turbo code uses parallel encoding, in contrast to a serial encoding used in serial-concatenated code. Such a difference presents a difficulty for a receiver attempting to provide decoding functionality for both turbo and serial-concatenated codes.

Therefore, there is a need for a method and apparatus with minimal complexity for fast and efficient decoding of encoded data symbols in a receiver.

SUMMARY OF THE INVENTION

According to various embodiments of the invention, a method and apparatus for decoding a data symbol $X_i$ of a plurality of data symbols $X_i$, with subscript (i) having a value from (1) to (k), (k) being a finite number, includes determining initially a data symbol estimate for a number of data symbols of the plurality of data symbols $X_i$. A data symbol estimate is determined for a number of data symbols of a plurality of data symbols $Y_i$. The plurality of data symbols $Y_i$ are produced in a transmitter in the communication system by encoding the plurality of data symbols $X_i$ according to a first convolutional code. A data symbol estimate is determined for a number of data symbols of a plurality of data symbols $W_i$. The plurality of data symbols $W_i$ are produced in the transmitter by interleaving, in case of serial-concatenated code, the is plurality of data symbols $Y_i$ and $X_i$, and in case of turbo code, the plurality of data symbols $X_i$, to produce a plurality of data symbols $Z_i$. The plurality of data symbols $Z_i$ are encoded according to a second convolutional code to produce the plurality of data symbols $W_i$. The estimates of data symbols $X_i$ and $Y_i$ pass to a first decision node. The estimates of data symbols $X_i$ and $Y_i$ passing to the first decision node include the estimates for the variables in an equation $F1(X_i, Y_i)$. The variables $X_i$ and $Y_i$ in the equation $F1$ are determined according to the first convolutional code. The estimates of data symbols $W_i$ and $Z_i$ pass to a second decision node. The estimates of data symbols $W_i$ and $Z_i$ passing to the second decision node include the estimates for the variables in an equation $F2(W_i, Z_i)$. The variables $W_i$ and $Z_i$ in the equation $F2$ are determined according to the second convolutional code. The estimates for the variables $Z_i$ include the estimates of data symbols $X_i$, or $Y_i$, or $X_i$ and $Y_i$ determined according to the interleaving. While equating the equations $F1$ and $F2$ to zero at respectively the first and second decision nodes, a new estimate is determined for each occurrence of the data symbol $X_i$ at the first and second decision nodes. A new estimate for the data symbol $X_i$ is determined based on the estimate determined at the initial step and the new estimate for each occurrence of the data symbol $X_i$ at the first and second decision nodes.

The new estimate for the data symbol $X_i$ may confidently hold a true value for the data symbol $X_i$. The process may repeated many times until the new estimate for the data symbol $X_i$ confidently holds a true value for the data symbol $X_i$. When more than one iteration is necessary to build the confidence level, an embodiment of the invention includes determining a normalized estimate of data symbol $X_i$ based on the estimate determined at the initial step and at least one of the new estimates for each occurrence of the data symbol $X_i$ at the first and second decision nodes. The steps of passing estimates of data symbols to the first and second nodes are repeated while substituting the normalized estimate of data symbol $X_i$ for at least one of the estimates of data symbols $X_i$. As such, an embodiment of the invention provides a method and apparatus for determining at the same time in a parallel fashion estimates of the plurality of data symbols $X_i$ with minimal delay and complexity.

DETAILED DESCRIPTION OF THE PREFERRED EMBODIMENT(S)

Various embodiments of the invention may be more apparent by making references to the following diagrams.

Figure 1:
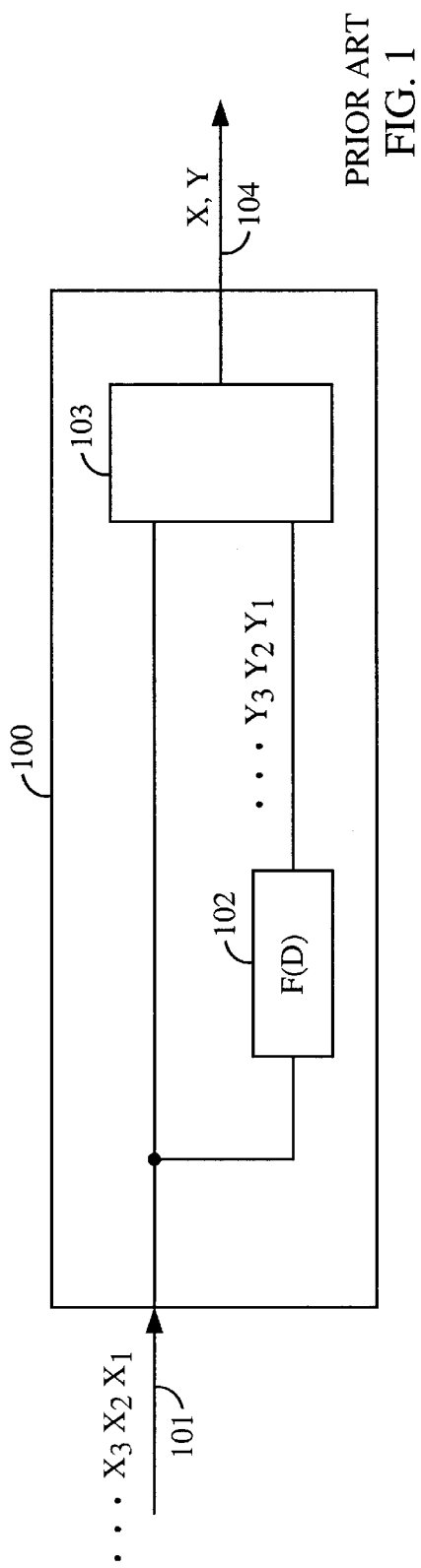
FIG. 1 depicts a general block diagram of a conventional encoder.

Referring to FIG. 1, a general block diagram of a conventional encoder 100 is shown. Encoder 100 at an input 101 inputs data symbols Xi for encoding. An encoding block 102 encodes the input data symbols according to a convolutional code defined by a transfer function F(D). The transfer function F(D) may be according to any convolutional code transfer function. A commonly used function may be defined by a relationship: $F(D)=(1+D+D^{**}2)/(1+D)$, where D denotes a delay step and the plus sign (+) denotes an exclusive OR operation. Implementation of such a function is well known by one of ordinary skill in a relevant art. Encoding block 102 outputs data symbols Yi. Data symbols Xi and Yi pass to a data symbol selector block 103. Data selector block 103 may include data symbol multiplexing and puncturing functions (not shown). Block 103 outputs two data symbols for every input data symbol Xi for a coding rate of ½. Other possible coding rates are also possible. As a result, encoder 100 outputs at an output 104 encoded data symbols consisting of data symbols Xi and Yi.

Figure 2:
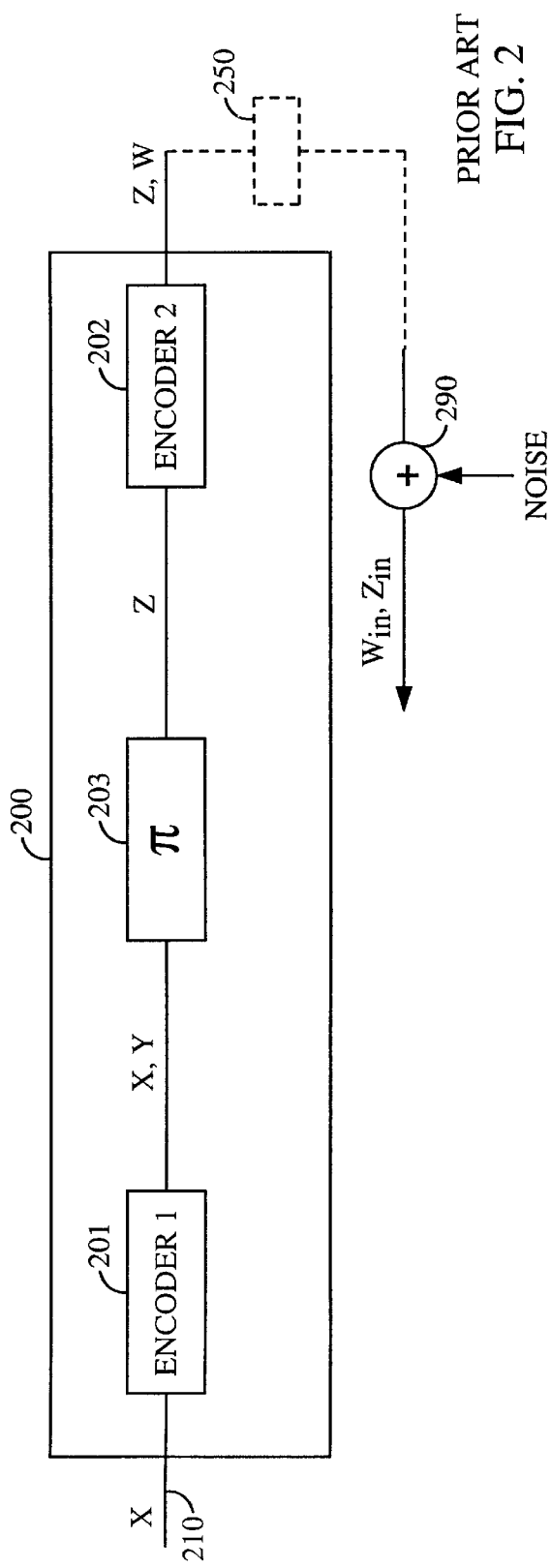
FIG. 2 depicts a general block diagram of a conventional encoder encoding data symbols according to a serial-concatenated code (SCC).

Referring to FIG. 2, a general block diagram of a conventional serial-concatenated code (SCC) 200 is shown. SCC 200 includes first and second encoder blocks 201, 202. An interleaver block 203 is inserted between encoders 201 and 202. SCC 200 inputs data symbols Xi at an input 210 of encoder 201. Encoder 201 after encoding produces data symbols Xi and Yi according to an operation shown and explained for encoder 100 of FIG. 1. Interleaver 203 inputs data symbols Xi and Yi for an interleaving operation. The interleaving operation in interleaver 203 may be according to any of the known interleaver operations. An interleaving operation may include reading the input data symbols and outputting them as data symbols Zi according to a mapping scheme. Such a mapping scheme may be based on a random process. Data symbols Zi consist of data symbols Xi and Yi re-arranged in an order according to the mapping function. Such interleaving operations are well known to one of ordinary skill in the art. It is possible that data symbols Zi include only data symbols Xi or data symbols Yi for several consecutive data symbols Zi depending on the mapping function. Encoder 202 encodes data symbols Zi and outputs data symbols Wi according to an encoding function used in encoder 202. SCC 200 outputs Data symbols Zi and Wi. Encoding functions used in encoders 201 and 202 may be the same or different.

Data symbols Wi and Zi are transmitted from a transmitter in a communication system to a destination user. Transmission of data symbols Zi and Wi may include signal processing, up-conversion to an appropriate frequency, and signal amplification. Such a transmitter is well known to one of ordinary skill in the art. The entire process of transmission, propagation, and reception by the destination user may be collectively modeled as a channel 250. The propagation of the transmitted signal in the channel and reception mainly includes adding noise and interference to data symbols Wi and Zi, shown as Win and Zin for the noisy versions of Wi and Zi. The process of adding noise is collectively shown at a summing block 290. A decoder in the receiver then receives data symbols Win and Zin. To decode the data symbols, the received signal may go through signal processing, frequency conversion and signal conditioning. Such functions are well known to one of ordinary skill in the art. The subscript (n) for the noisy versions of data symbols in the receiver is eliminated in the subsequent description in order to simplify the explanation of various related embodiments of the invention. One of ordinary skill in the art recognizes that data symbols processed in the receiver are the noisy versions without carrying the subscript (n).

Figure 3:
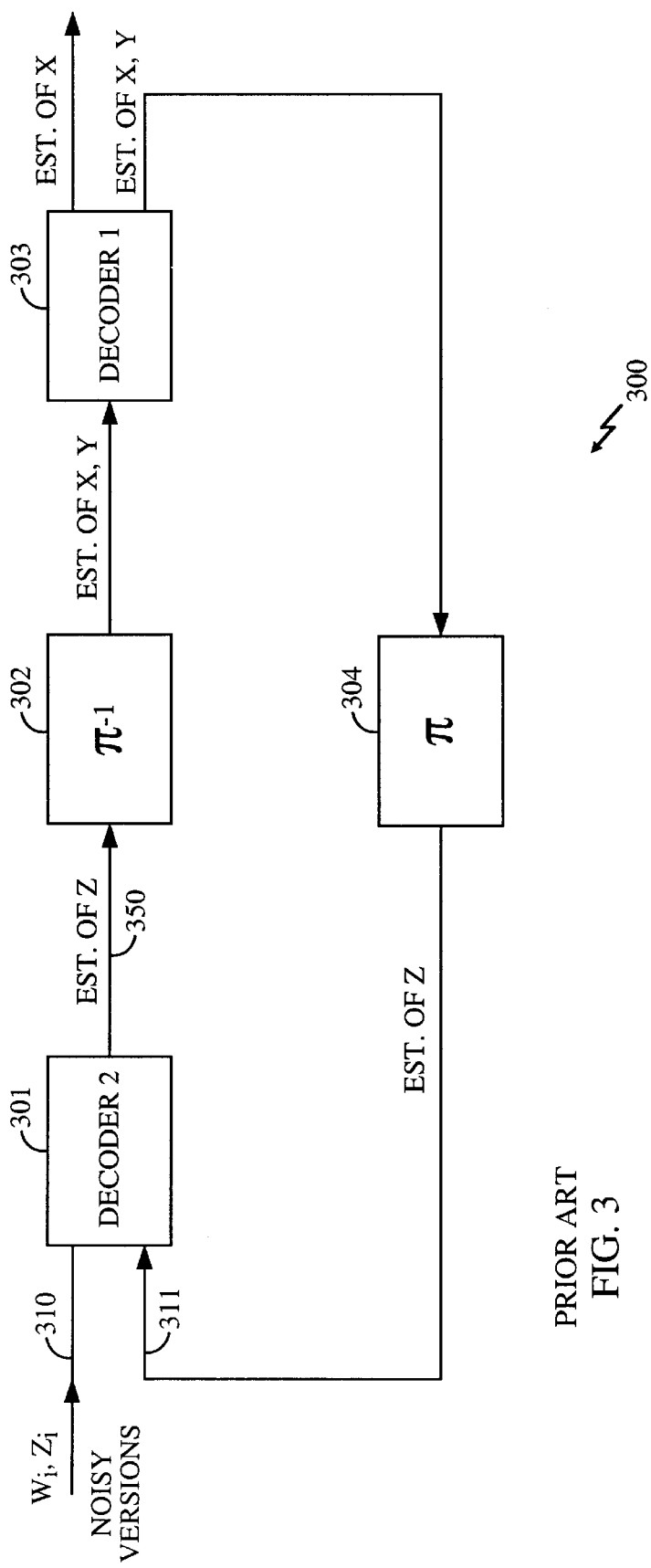
FIG. 3 depicts a block diagram of a conventional decoder for decoding data symbols encoded according to a serial-concatenated code.

Referring to FIG. 3, a block diagram of a conventional decoder 300 for decoding data symbols Wi and Zi to produce estimates of data symbols Xi is shown. The decoding process is the reverse of the encoding process used in SCC 200. Decoder 300 includes a decoder 301 for decoding data symbols Wi and Zi according to a coding function used in the second encoder block 202 in the transmitter portion. Decoder 301 produces estimates of data symbols Zi at an output 350. Estimates of data symbols Zi at output 350 pass through a de-interleaver 302 to produce estimates of data symbols Xi and Yi. De-interleaver 302 operates according to a reverse interleaving function used in interleaver 203. Estimates of data symbols Xi and Yi pass to a decoder 303 to produce estimates of data symbols Xi. Decoder 303 operates according to a coding function used in the first encoder block 201.

To increase confidence level for accuracy of the estimates of data symbols Xi, decoder 303 also produces estimates of data symbols Yi and passes estimates of data symbols Xi and Yi to an interleaver 304 to produce estimates of Zi. Interleaver 304 operates according to the operations of interleaver 203 in the transmitter portion. Estimates of data symbols Zi, produced by interleaver 304, input decoder 301 at an input 311. Estimates of data symbols Zi are used with data symbols Wi and Zi in decoder 301 to produce estimates of data symbols Zi at output 350. A new estimate for each data symbol Zi at output 350 is produced after each iteration. The new estimates of data symbols Zi pass to de-interleaver 302 to produce new estimates of data symbols Xi and Yi. The process in decoder 303 is repeated with the new estimates of data symbols Xi and Yi to produce a new estimate for the data symbol Xi. After each iteration, the new estimate of data symbol Xi has a higher confidence level to hold a true value than the previous estimate. The process may be repeated until the confidence level of an estimate of data symbol Xi reaches an acceptable level. The estimate with the highest confidence level is selected to hold a true value of the data symbol Xi.

Decoding process accordingly may take a long time. The estimates of data symbols Xi may not be produced unless each data symbol has been processed at least through two decoding steps, namely decoders 301 and 303. Moreover, the process of decoding data symbols Xi includes serial processing of data symbols. Therefore, decoding data symbols Xi according to a conventional method is inefficient for an application that requires fast decoding process. Such an application includes wireless communication of voice and data in a CDMA communication system. Such a system has been described in the communication standard commonly known as TIA/EIA/IS-95 and its subsequent advancements in TIA/EIA/IS-2000. Publications describing IS-95 and IS-2000 systems entitled: Mobile Base-station Compatibility Standard, are publicly available, and incorporated by reference herein.

Figure 4:
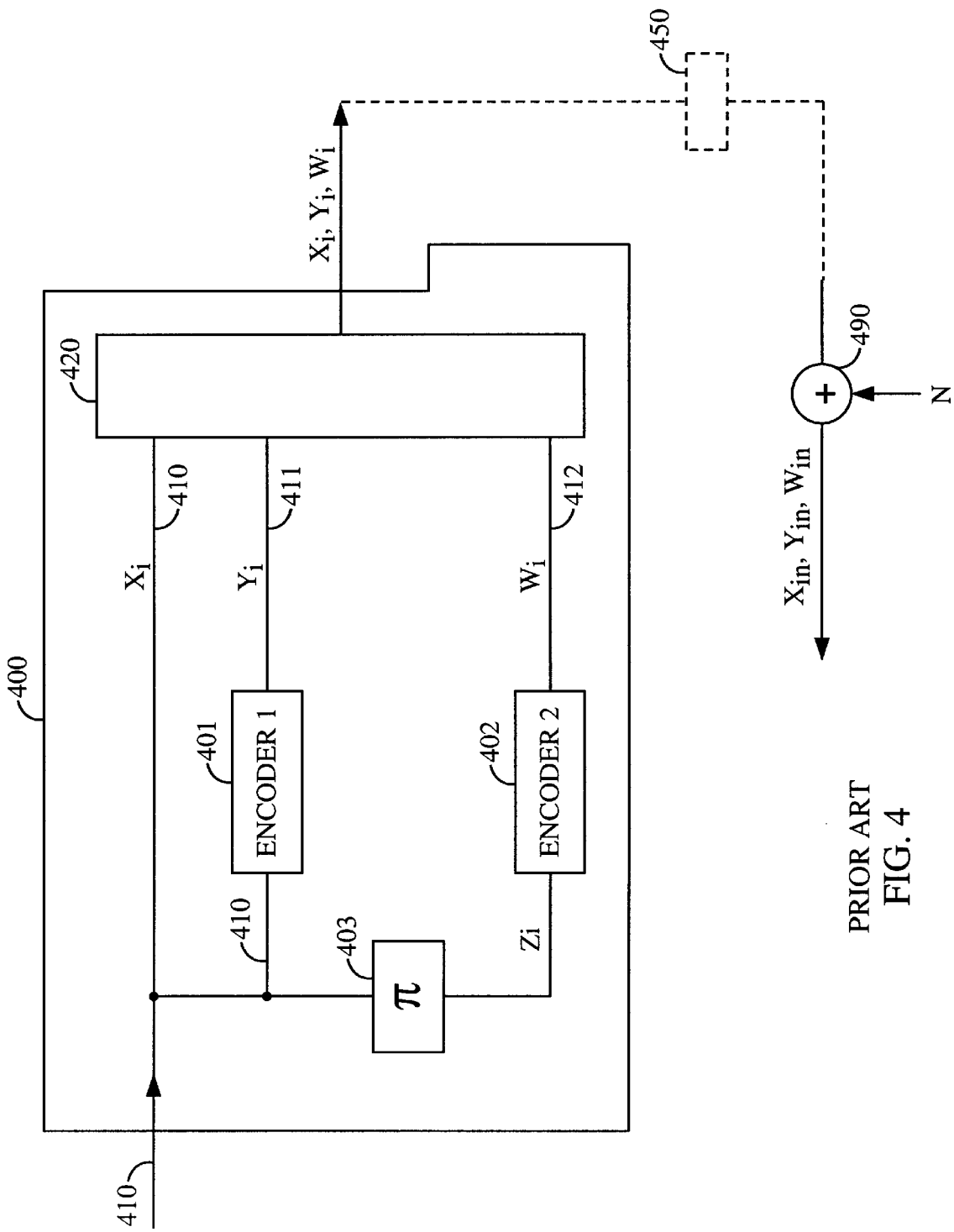
FIG. 4 depicts a general block diagram of a conventional encoder encoding data symbols according to a turbo code.

Similar problems and difficulties exist if the transmitted data symbols are encoded using a turbo code. Referring to FIG. 4, a general block diagram of a conventional turbo code 400 is shown. Turbo code 400 includes a first and second encoder blocks 401 and 402 and an interleaver block 403. Data symbols Xi input turbo code 400 at an input 410 of encoder 401. Encoder 401, after encoding, produces data symbols Yi according to an operation shown and explained for encoder 102. Data symbols Xi input interleaver 403 for an interleaving operation to produce data symbols Zi. The interleaving operation in interleaver 403 may be according to any of the known interleaver operations. Data symbols Zi consist of data symbols Xi re-arranged in an order according to a mapping function. Encoder 402 encodes data symbols Zi and outputs data symbols Wi according to an encoding function used in encoder 402. Encoding functions used in encoders 401 and 402 may be the same or different. Data symbols Xi, Yi and Wi pass to a puncturing block 420. Puncturing block 420 receives data symbols Xi at input 410, data symbols Yi produced by encoder 401 at an input 411, and data symbols Wi produced by encoder 402 at an input 412. Puncturing block 420 according to a puncturing pattern selects data symbols from data symbols Xi, Yi and Wi. The selected data symbols pass to a transmitter portion for transmission to a remote receiver. As such, the transmitted data symbols consist mainly of data symbols Xi, Yi and Wi.

Transmission of data symbols Xi, Yi and Wi may include signal processing, up-conversion to an appropriate frequency and signal amplification. Such a transmitter is well known by one of ordinary skill in the art. The entire process of transmission, propagation and reception by the destination user may be collectively modeled as a channel 450. The process mainly includes adding noise and interference to data symbols Xi, Yi and Wi, shown as data symbols Xin, Yin and Win for the noisy versions of respectively data symbols Xi, Yi and Wi. The process of adding noise is collectively shown at a summing block 490. A decoder in the receiver then receives data symbols Xin, Yin and Win. To decode the data symbols, the received signal may go through signal processing, frequency conversion and signal conditioning. Such functions are well known to one of ordinary skill in the art. The subscript (n) for the noisy versions of data symbols in the receiver is eliminated in order to simplify the explanation of the various related embodiments of the invention. One of ordinary skill in the art recognizes that data symbols processed in a receiver are the noisy versions without carrying the subscript (n).

Figure 5:
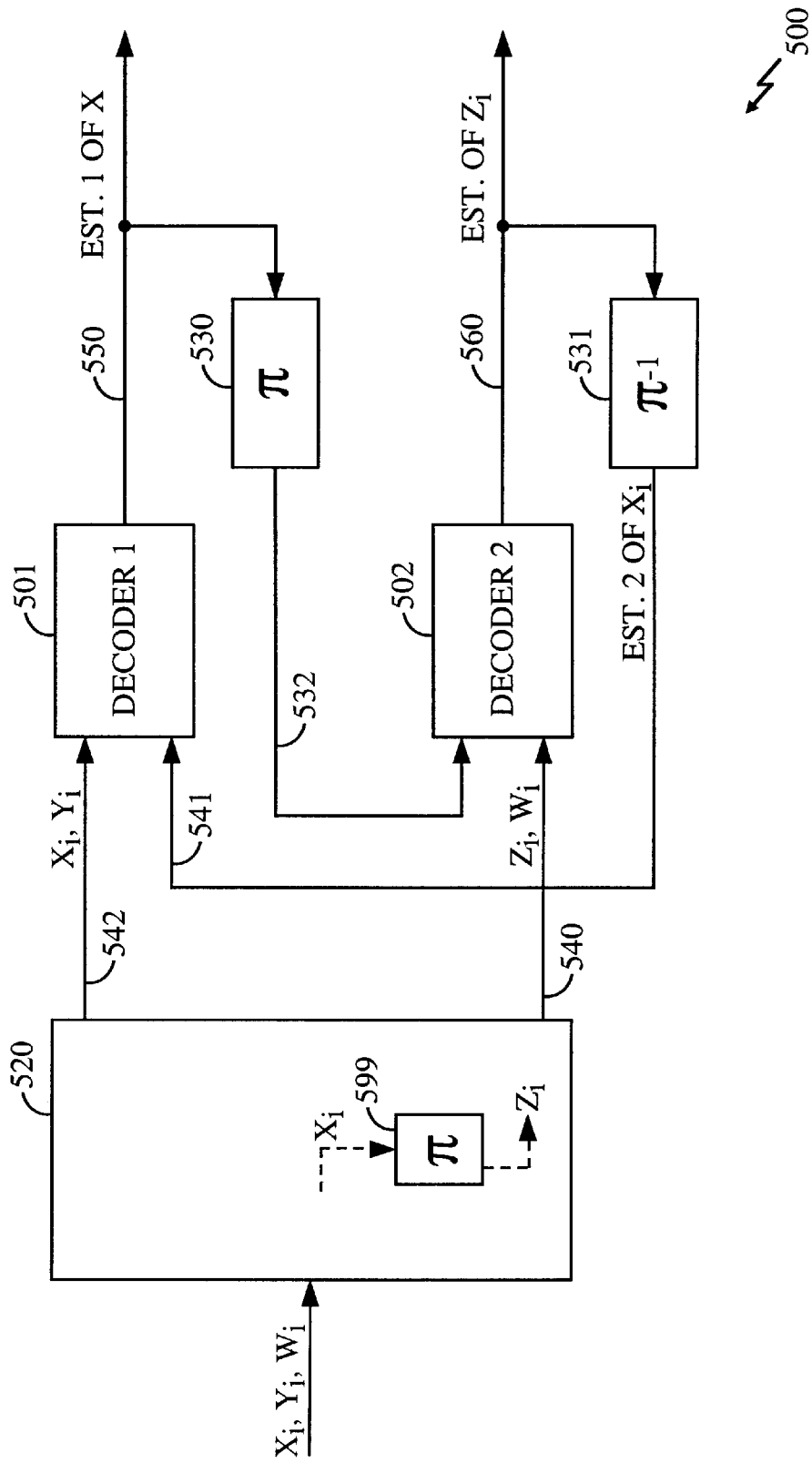
FIG. 5 depicts a block diagram of a conventional decoder for decoding data symbols encoded according to a turbo code.

Referring to FIG. 5, a block diagram of a conventional decoder 500 is shown for decoding data symbols Xi, Yi and Wi to produce estimates of data symbols Xi. The decoding process is reverse of the encoding process used in encoder 400. Data symbols Xi, Yi and Wi pass through a data symbol selector block 520 which operates to select data symbols Xi and Yi for routing to a decoder block 501 at an input 542. Data symbols Xi internally pass through an interleaver 599 to reproduce data symbols Zi. Data symbols Zi and Wi pass to a decoder block 502 at an input 540. Decoder 501 decodes data symbols Xi and Yi according to a coding function used in encoder block 401. Decoder 501 produces estimates of data symbols Xi at an output 550. Decoder 502 decodes data symbols Zi and Wi according to a coding function used in encoder block 402. Decoder 502 produces estimates of data symbols Zi at an output 560.

To increase confidence for estimates to hold true value of the data symbols Xi, estimates of data symbols Xi at output 550 pass through an interleaver 530 to produce estimates of data symbols Zi at an input 532 of decoder 502. Decoder 502 uses the estimates of data symbols Zi at input 532 with estimates of data symbols at input 540 to produce new estimates of data symbols Zi at output 560. Estimates of data symbols Zi at output 560 pass through a de-interleaver 531 to reverse the process of interleaving function of interleaver 430 in the turbo code 400, and to produce estimates of data symbols Xi at an input 541. Estimates of data symbols Xi at input 541 are used with estimates of data symbols at input 542 to produce estimates of data symbols Xi at output 550. The process may be repeated until confidence for estimates of data symbols Xi reaches an acceptable level.

Decoding process for a turbo encoded signal accordingly may take a long time. The estimates of data symbols Xi with high confidence may not be produced unless data symbols have been processed at least through two decoding steps, namely decoders 501 and 502. Moreover, the process includes serial processing of data symbols. Therefore, decoding data symbols Xi according to a conventional method is inefficient for an application that requires fast decoding process. Such an application includes wireless communication of voice and data in a CDMA communication system. Such a system has been described in the communication standard commonly known as TIA/EIA/IS-95 and its subsequent advancements in TIA/EIA/IS-2000. Publications describing IS-95 and IS-2000 systems entitled: Mobile Base-station Compatibility Standard, are publicly available.

A receiver incorporating an embodiment of the invention greatly benefits from various aspects of the invention. An embodiment of the invention provides a fast decoding operation for determining accurate estimates of data symbols Xi with high confidence. The advantages of an embodiment of the invention include providing decoding operations in an embodiment for data symbols that have been encoded according to either serial-concatenated code or turbo code.

According to an embodiment of the invention, the decoding process is limited to operations over data symbols Xi, Yi and Wi. In case the data symbols have been encoded according to SCC 200, data symbols Xi, data symbols Yi at output of encoder 201 and data symbols Wi at the output of encoder 202 are used in the decoding operations. In case the data symbols have been encoded according to turbo code 400, data symbols Xi, data symbols Yi at output 411 of encoder 401 and data symbols Wi at output 412 of encoder 402 are used in the decoding operations. As such, while using the same data symbol references in SCC 200 and turbo code 400, various embodiments of the invention may be explained.

Figure 6:
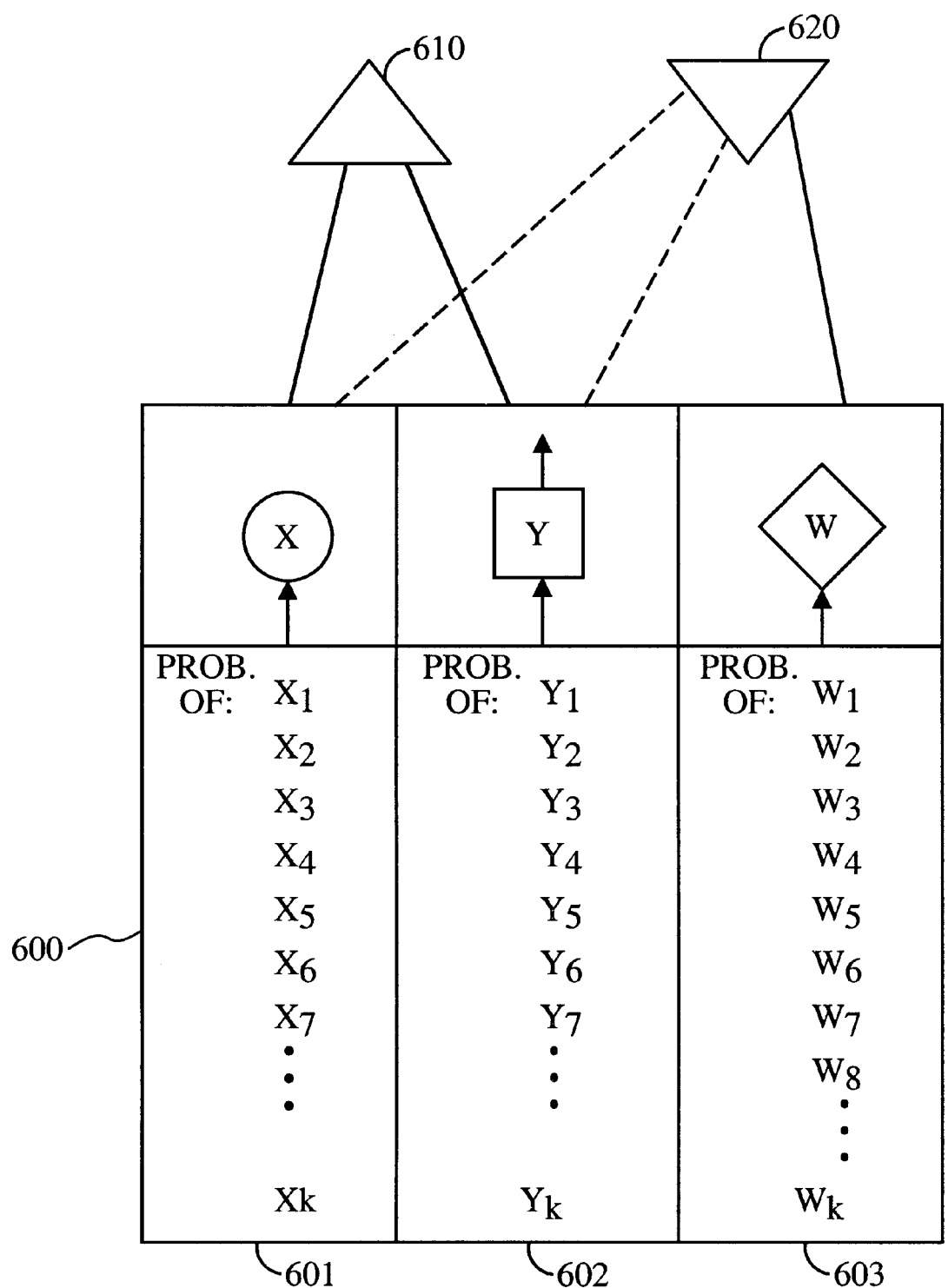
FIG. 6 depicts a decoding process according to various embodiments of the invention for decoding operations on a block of data having a length of "k" data symbols, "k" being a finite number.

Referring to FIG. 6, the decoding process according to various embodiments of the invention includes operations on a block of data having a length of "k" data symbols, "k" being a finite number. Initially, a data symbol estimate for a number of data symbols of the plurality of data symbols Xi is determined. The value for each estimate of data symbols Xi is shown in column 601. A data symbol estimate is determined for a number of data symbols of a plurality of data symbols Yi. The value for each estimate of data symbols Yi is shown in column 602. The plurality of data symbols Yi are produced in a transmitter in the communication system by encoding the plurality of data symbols Xi according to a first convolutional code. The first convolutional code, in case of SCC 200, is used in encoder 201, and in case of turbo code 400, in encoder 401. A data symbol estimate is determined for a number of data symbols of a plurality of data symbols Wi. The value for each estimate of data symbols Wi is shown in column 603. In case of SCC 200, the plurality of data symbols Yi and Xi, and in case of turbo code 400, the plurality of data symbols Xi, are interleaved to produce a plurality of data symbols Zi. The plurality of data symbols Zi are encoded according to a second convolutional code to produce the plurality of data symbols Wi. The second convolutional code is used in encoder 202 in case of SCC 200, and in case of turbo code 400, encoder 402.

For a case of Gaussian noise, the estimate for each data symbol may be determined by a Gaussian probability process. For example, to determine an estimate of data symbol Xi, the process determines the probability of data symbol Xi having a value equal to "1" given the value of its noisy version metric. Estimating the value of a data symbol based on a probability process is well known by one of ordinary skill in the art. As such, an initial estimate of data symbols Xi, Yi and Wi may be determined and stored in a table 600 having columns 601, 602 and 603 for respectively data symbols Xi, Yi and Wi. The information contained in table 600 may be stored in a memory device.

Figure 7:
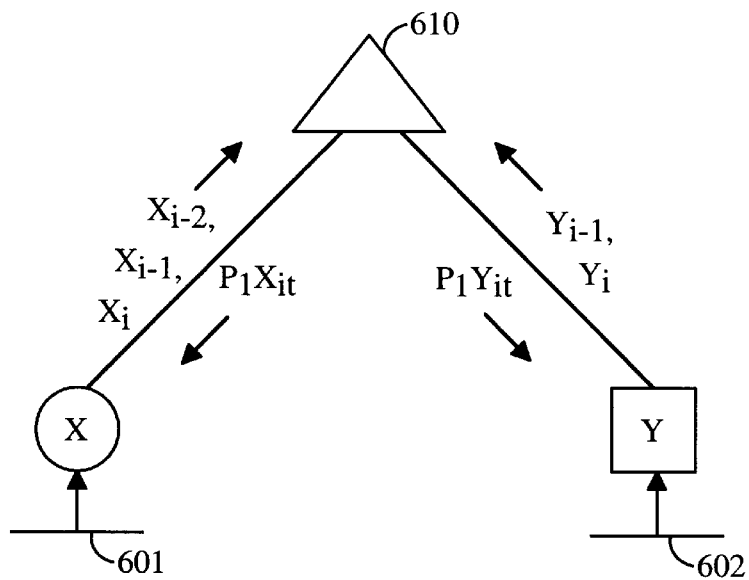
FIG. 7 depicts passing estimates of data symbols $X_i$ and $Y_i$ to a first decision node as a part of the decoding process according to various embodiments of the invention.

FIGS. 6 and 7 show the estimates of data symbols Xi and Yi passing to a first decision node 610. The estimates of data symbols Xi and Yi passing to the first decision node 610 include estimates for the variables in an equation F1(Xi, Yi). The variables Xi and Yi in the equation F1 are determined according to the first convolutional code. For example, if the first convolutional code is governed by a relationship defined by: F1(D)=(1+D+D2)/(1+D), then F1(Xi,Yi) is equal to: Yi+Y(i−1)+Xi+X(i−1)+X(i−2). For example, if "i" is equal to seven, then F1 is equal to: Y7+Y6+X7+X6+X5. The estimates for data symbols Y7, Y6, X7, X6 and X5 may be retrieved from columns 601 and 602**.

Figure 8:
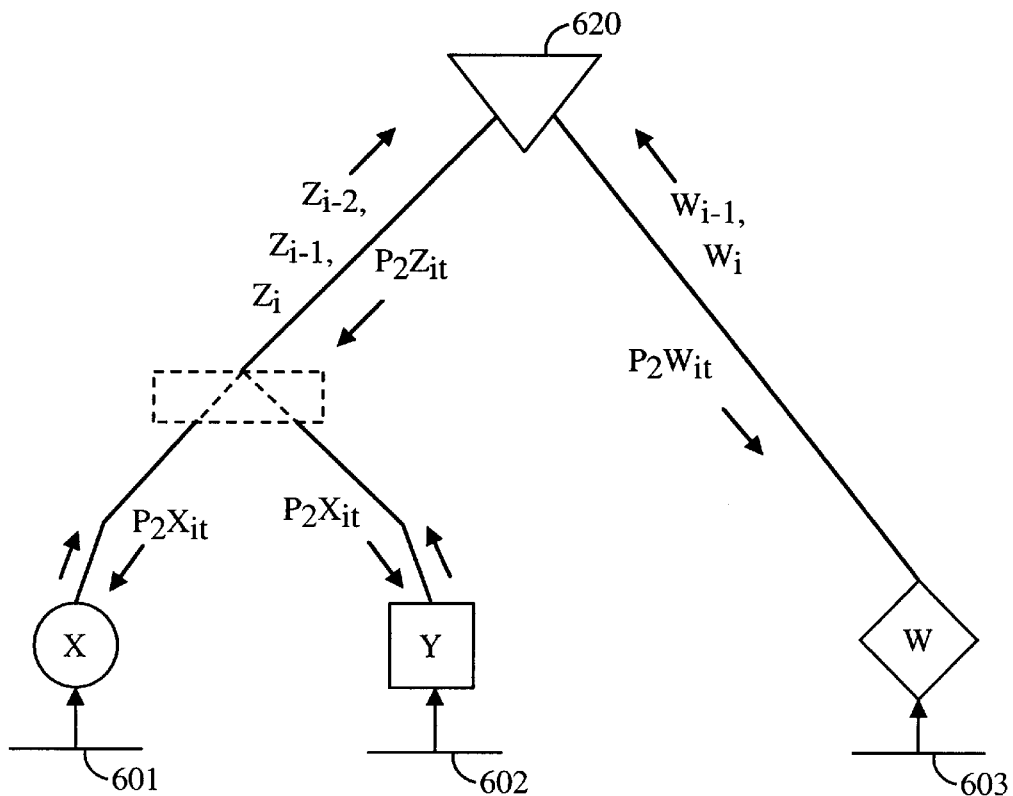
FIG. 8 depicts passing the estimates of data symbols Wi and Zi to a second decision node as a part of the decoding process according to various embodiments of the invention.

Referring to FIGS. 6 and 8, the estimates of data symbols Wi and Zi are shown to pass to a second decision node 620. The estimates of data symbols Wi and Zi passing to the second decision node 620 include estimates for the variables in an equation F2(Wi, Zi). The variables Wi and Zi in the equation F2 are determined according to the second convolutional code. The first and the second convolutional codes may be the same. The estimates for the variables Zi include the estimates of data symbols Xi, or Yi, or Xi and Yi, determined according to the interleaving function used, in case of SCC 200, in interleaver 203, and in case of turbo code 400, interleaver 403. The variables selected for equation F2 include the variables taken from columns 601, 602 and 603, or columns 601 and 603, or columns 602 and 603.

For an illustration purpose, for example if F2(D)=(1+D+D2)/(1+D), then F2(Zi,Wi)=Wi+W(i−1)+Zi+Z(i−1)+Z(i−2). In case of SCC 200, the variables Zi may include Xi, or Yi, or Xi and Yi since input to the interleaver 203 include both data symbols Xi and Yi. Depending on the interleaving function, the output of the interleaver for several consecutive data symbols may include exclusively data symbols Xi or data symbols Yi. At other times, the output may include both data symbols Xi and Yi for several consecutive data symbols. As such, the estimates for the variables Zi include the estimates of data symbols Xi, or Yi, or Xi and Yi taken from columns 601 and 602. The estimates for the variables Wi and W(i+1) are taken from column 603**.

In case of turbo code 400, the variables selected for equation F2 include the variables taken from columns 601 and 603 since the input to the interleaver 403 includes only data symbols Xi. As such, the variables selected for equation F2, in the case of turbo code 400, include the variables Xi and Wi taken from respectively columns 601 and 603.

To provide capability for decoding data symbols in either an SCC or a turbo code mode, the decoding process according to an embodiment of the invention allows selecting the variables from columns 601, 602 and 603. As such, the decoding process allows decoding data symbols that were encoded in a transmitter according to either an SCC or a turbo code.

While equating the equations F1 and F2 to zero at respectively the first and second decision nodes 610 and 620, a new estimate is determined for each occurrence of the data symbol Xi at the first and second decision nodes 610 and 620. By way of an example at node 610 for equation F1, for "i=7", the probability of the estimated values for Y7, Y6, X7, X6 and X5 may be respectively: P(Y7)=0.8, P(Y6)=0.7, P(X7)=0.5, P(X6)=0.2 and P(X5)=0.6. A new estimate for X7 is computed based on estimated values of a set of data symbols including data symbols: Y7, Y6, X6 and X5. Accordingly, a new estimate for P(X(i=7)) equal to "1", in case of equating equation F1 to zero, may be equal to the probability of having an odd number of "1's" in the set of data symbols Y7, Y6, X6 and X5. Since there are four data symbols, in this case, there is a possibility of having one or three data symbols having a value equal to "1." Therefore, the probability of data symbol X7 may be determined as follows:

$$P(X7)=P(Y7)*(1-P(Y6))*(1-P(X6))*(1-P(X5))+(1-P(Y7))*P(Y6)*P(X6)*P(X5)+P(Y6)*(1-P(Y7))*(1-P(X6))*(1-P(X5))+(1-P(Y6))*P(Y7)*P(X6)*P(X5)+P(X6)*(1-P(Y7))*(1-P(Y6))*(1-P(X5))+(1-P(X6))*P(Y7)*P(Y6)*P(X5)+PX5)*(1-P(Y7))*(1-P(Y6))*(1-P(X6))+(1-P(X5))*P(Y7)*P(Y6)*P(X6).$$

Note that, probability of, for example, P(1−X6) is probability of X6 having a value of zero when estimates of Xi in column 601 represent values of the estimates of Xi having a value of "1."

The number of occurrences of X7 in equation F2 depends on the interleaving function used in the respective encoder interleaver, interleaver 403 or 203. As indicated, for a given value of "i", F2 may not include any variables related to data symbols Xi. As such, there may or may not be an occurrence of Xi in equation F2 for a given value of "i. " If there is an occurrence of X7, in this example, in equation F2, a new estimate for the occurring data symbol Xi is determined like the example shown for the equation F1.

Moreover, since values in column 601, 602 and 603 may pass to nodes 610 and 620 at the same time while operating on different values of "i", more than one P(Xi) value may pass to nodes 610 and 620. This may be clear by noting that, while relating to equation F1, for a given "i" value, values for the variables: Yi+Y(i−1)+Xi+X(i−1)+X(i−2), for "i+1", values for the variables: Y(i+1)+Y(i)+X(i+1)+X(i)+X(i−1), and for "i+2", values for the variables: Y(i+2)+Y(i+1)+X(i+2)+X(i+1)+X(i) pass to node 610. As such, since an embodiment of the invention includes parallel processing of data symbols, in this example, three occurrences of estimates of Xi may appear at node 610. Note that, the values of Xi involving in three consecutive "i" values is due to using an encoding function defined by the relationship: (1+D+D**2)/(1+D). If a different encoding function is used, the number of occurrences of Xi for a given "i" value may be different.

Figure 9:
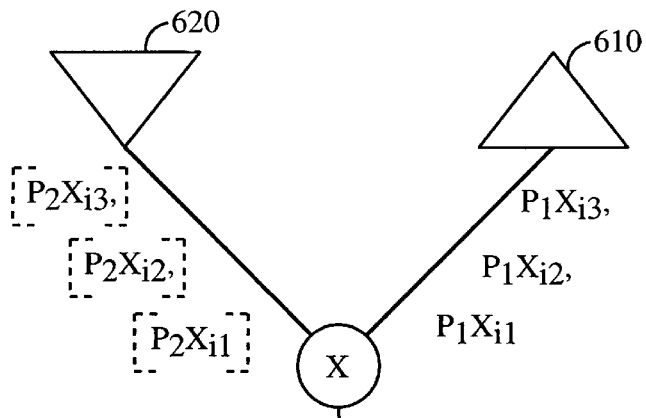
FIG. 9 depicts an example of passing three estimates of data symbols Xi involved in three occurrences at a decision node for determining a normalized value and a new estimate for data symbol Xi.

A new estimate for the data symbol Xi is determined based on the estimate determined at the initial step and the new estimate for each occurrence of the data symbol Xi at the first and second decision nodes 601 and 602. Referring to FIG. 9, for example, three estimates of data symbols Xi involved in three occurrences at node 610 pass to a node 900 for determining a new estimate for data symbol Xi. Moreover, depending on the interleaver function used in the encoding process, estimates of data symbol Xi may also have passed to node 620 as a part of data symbols Zi involved in the encoding function. As such, there is a possibility of having an estimate of data symbol Xi pass from node 620 to node 900 for determining a new estimate for Xi at node 900. The new estimate for data symbol Xi may be a normalized product of the initial estimate and all estimates of data symbol Xi pass from nodes 610 and 620. For example, if there has been a total of "L" occurrences of Xi, node 900 receives "L" number of estimates of data symbol Xi. The new estimate for Xi may then be equal to: $(P(0)P(1)P(2)P(3) \ldots P(L-1)P(L))/[(P(0)P(1)P(2)P(3) \ldots P(L-1)P(L)+(1-P(0))(1-P(1))(1-P(2))(1-P(3)) \ldots (1-P(L-1))(1-P(L))]$, where P denotes an estimate value of Xi for each occurrence passed to node 900. Note that P(0) is the initial estimate, and others are the new estimate for each occurrence of the data symbol Xi at the first and second decision nodes.

The new estimate determined at node 900 for the data symbol Xi may confidently hold a true value for the data symbol Xi. The process may be repeated many times until the new estimate for the data symbol Xi confidently holds a true value for the data symbol Xi. When more than one iteration is necessary to build the confidence level, an embodiment of the invention includes determining a normalized estimate of data symbol Xi based on the estimate determined at the initial step and at least one of the new estimates for each occurrence of the data symbol Xi at the first and second decision nodes 610 and 620. The steps of passing data symbols to the first and second nodes 610 and 620 are then repeated while substituting the normalized estimate of data symbol Xi for at least one of the estimates of data symbols Xi passing to the first and second nodes 610 and 620. Preferably, all estimates of data symbols Xi passing to nodes 610 and 620 after the first iteration are the normalized versions.

To determine an estimate for a normalized version of data symbol Xi, each estimate of data symbols Xi determined for each occurrence of data symbol Xi at nodes 610 and 620 and the initial estimate of Xi are used. For illustration purpose, let's assume, three occurrences of data symbol Xi took place, for example, at node 610, and none at node 620. The estimates determined for occurrences of data symbol Xi maybe labeled Xi1, Xi2 and Xi3. The reason for having three occurrences is due to having Xi involved in three F1 equations, in this example. The number following the subscript "i" identifies the F1 equation that used the Xi value. The initial value may be labeled Xi0. A normalized value for data symbol Xi to be used in the first F1 equation may be equal to: $(P(Xi0)*P(Xi2)*P(Xi3))/[(P(Xi1)*P(Xi2)*P(Xi3))+(1-P(Xi0))*(1-P(Xi2))*(1-P(Xi3))]$. A normalized value for data symbol Xi to be used in the second F1 equation, for example at node 610, may then be equal to: $(P(Xi0)*P(Xi1)*P(Xi3))/[(P(Xi1)*P(Xi2)*P(Xi3))+(1-P(Xi0))*(1-P(Xi1))*(1-P(Xi3))]$. The normalized value for data symbols Xi to be used in the third F1 equations are also determined in a similar fashion. The normalized value of data symbol Xi to be used for the and for the third F1 equation may be equal to: $(P(Xi0)*P(Xi1)*P(Xi2))/[(P(Xi1)*P(Xi2)*P(Xi3))+(1-P(Xi0))*(1-P(Xi1))*(1-P(Xi2))]$.

Figure 10:
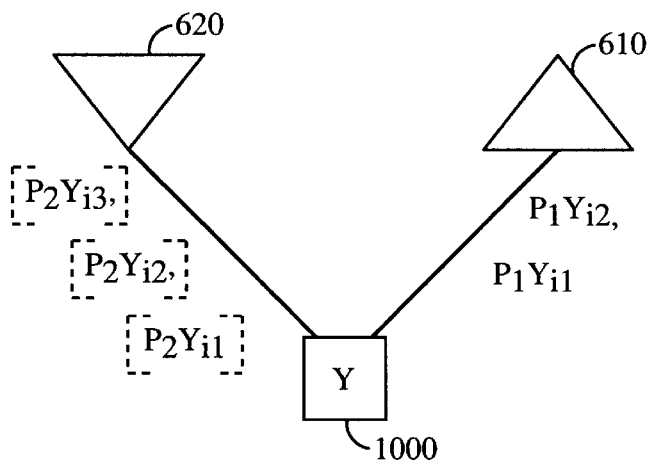
FIGS. 10 and 11 depict the processes of determining a new estimate and a normalized value for data symbols Yi and Wi which are similar to the process for determining a new estimate and a normalized value for data symbols Xi.
Figure 11:
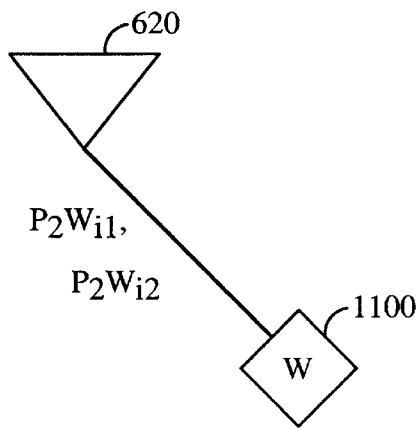

FIGS. 10 and 11 show the processes of determining a new estimate and a normalized value for data symbols Yi and Wi which are similar to the process explained for determining a new estimate and a normalized value for data symbols Xi. When equations F1 and F2 are set to zero to determine a new estimate for data symbol Xi, a new estimate for each occurrence of the data symbol Yi at the first and second decision nodes are also determined when the process takes more than one iteration. Consequently, for a subsequent determination of estimates while equating equations F1 and F2 to zero, a normalized estimate of data symbol Yi is also determined. The normalized estimate of data symbol Yi is based on the initial estimate and at least one of the new estimates for each occurrence of the data symbol Yi at the first and second decision nodes 610 and 620. The steps of passing estimates of data symbols to the first and second decision nodes 610 and 620 are repeated while substituting the normalized estimate of data symbol Yi for at least one of the estimates of data symbols Yi passing from a node 1000 to nodes 610 and 620. Preferably, the estimates of data symbols Yi passing from node 1000 to nodes 610 and 620 all include the normalized version after the first iteration.

Similarly for data symbol Wi, when equations F1 and F2 are set to zero to determine a new estimate for data symbol Xi, a new estimate for each occurrence of the data symbol Wi at the first and second decision nodes are also determined when the process takes more than one iteration. Consequently, for a subsequent determination of estimates while equating equations F1 and F2 to zero, a normalized estimate of data symbol Wi is also determined. The normalized estimate of data symbol Wi is based on the initial estimate and at least one of the new estimates for each occurrence of the data symbol Wi at the second decision node 620. Note that, data symbols Wi may occur only at node 620. The steps of passing estimates of data symbols to the first and second nodes 610 and 620 are repeated while substituting the normalized estimate of data symbol Wi for at least one of the estimates of data symbols Wi from a node 1100 to node 620. Preferably, the estimates of data symbols Wi passing from node 1100 to nodes 610 and 620 all include the normalized version after the first iteration.

The process of decoding by determining a new estimate of data symbols Xi may be repeated as many times as necessary until the confidence level for the estimate holding a true value for data symbol Xi rises to an acceptable level. Various embodiments of the invention may be implemented in a specific application signal processing hardware commonly known to one of ordinary skill in the art. Alternatively, or in combination, various embodiments of the invention may be implemented in a microprocessor environment, commonly known to one of ordinary skill in the art.

Advantages of an embodiment of the invention include providing capability for decoding data symbols encoded in a transmitter by either an SCC or turbo code. The receiver upon knowing the encoding method may reconfigure the selection of data symbols from table 600 to accommodate the appropriate decoding process. Moreover, since the decoding process takes place while allowing operations on multiple data symbols, many data symbols Xi may be decoded simultaneously. The process and operation over the respective data symbols are very similar. As a result, a software routine written to execute various steps may be reused with minimal reconfiguration for either SCC and turbo codes. Most common microprocessors and digital signal processor allow parallel processing operation to take place without sacrificing processing speed. As such, an embodiment of the invention allows fast and efficient decoding of a block of data symbols.

I claim:

1. A method for decoding a data symbol Xi of a plurality of data symbols Xi with subscript (i) having a value from (1) to (k) and (k) being a finite number, comprising the steps of:

determining a data symbol initial estimate for all data symbols of said plurality of data symbols Xi for "i" being equal from 1 to k, all data symbols of a plurality of data symbols Yi for "i" being equal from 1 to k, and all data symbols of a plurality of data symbols Wi for "i" being equal from 1 to k, wherein all data symbols of said plurality of data symbols Yi for "i" being equal from 1 to k are produced in a transmitter in said communication system by a first convolutional encoding of all data symbols of said plurality of data symbols Xi for different values of "i" between 1 and "k", wherein all data symbols of said plurality of data symbols Wi for "i" being equal from 1 to k are produced in said transmitter by interleaving all data symbols of said plurality of data symbols Xi, or Xi and Yi for different values of "i" between 1 and "k" to produce all data symbols of a plurality of data symbols Zi for "i" being equal from 1 to k, and a second convolutional encoding of all data symbols of said plurality of data symbols Zi for different values of "i" between 1 and "k" to produce all data symbols of said plurality of data symbols Wi for "i" being equal from 1 to k;

passing said estimates of data symbols Xi, Yi, and Wi for different values of "i" between 1 and "k" to a decision node, wherein said estimates of data symbols Xi, Yi, and Wi for different values of "i" between 1 and "k" passing to said decision node are determined according to said first and second convolutional encodings, wherein said estimates of data symbols Yi and Wi are in terms of estimates of data symbols Xi for different values of "i" between 1 and "k" based on said first and second convolutional encodings, thereby producing more than one occurrences of estimate of said data symbol Xi for different values of "i" between 1 and "k" at said decision node;

determining a new estimate for said data symbol Xi for different values of "i" between 1 and "k" based on said initial estimate and each occurrence of estimate of said data symbol Xi for different values of "i" between 1 and "k" at said decision node based on said passing.

2. The method as recited in claim 1 further comprising the steps of:

determining a normalized estimate of data symbol Xi for different values of "i" between 1 and "k" based on said initial estimate of data symbol Xi and at least one occurrence of estimate of said data symbol Xi for different values of "i" between 1 and "k" at said decision node based on said passing;

repeating said passing of estimates of data symbols Xi, Yi, and Wi for different values of "i" between 1 and "k" while substituting said normalized estimate of data symbol Xi for different values of "i" between 1 and "k" for at least one of said estimate of data symbols Xi for different values of "i" between 1 and "k" in said passing;

repeating determining a new estimate for said data symbol Xi for different values of "i" between 1 and "k" based on said initial estimate and each occurrence of estimate of said data symbol Xi for different values of "i" between 1 and "k" at said decision node based on said repeated passing.

3. The method as recited in claim 1 further comprising the steps of:

determining a new estimate for each occurrence of said data symbol Yi for different values of "i" between 1 and "k" at said decision node, based on said new estimates of Xi for different values of "i" between 1 and "k" at said decision node and in accordance with said first convolutional encoding;

determining a normalized estimate of data symbol Yi based on said initial estimate of data symbol Yi for different values of "i" between 1 and "k" and said new estimate of data symbol Yi for different values of "i" between 1 and "k" for at least one occurrence of said data symbol Yi for different values of "i" between 1 and "k" at said decision node;

repeating said passing of estimates of data symbols Xi, Yi, and Wi for different values of "i" between 1 and "k" while substituting said normalized estimate of data symbol Yi for different values of "i" between 1 and "k" for at least one of said estimate of data symbols Yi for different values of "i" between 1 and "k" in said passing;

repeating determining a new estimate for said data symbol Xi for different values of "i" between 1 and "k" based on said initial estimate and each occurrence of estimate of said data symbol Xi for different values of "i" between 1 and "k" at said decision node based on said repeated passing.

4. The method as recited in claim 1 further comprising the steps of:

determining a new estimate for each occurrence of said data symbol Wi for different values of "i" between 1 and "k" at said decision node, based on said new estimates of Xi for different values of "i" between 1 and "k" at said decision node and in accordance with said second convolutional encoding;

determining a normalized estimate of data symbol Wi for different values of "i" between 1 and "k" based on said initial estimate of data symbol Wi for different values of "i" between 1 and "k" and said new estimate of data symbol Wi for different values of "i" between 1 and "k" for at least one occurrence of said data symbol Wi for different values of "i" between 1 and "k" at said decision node;

repeating said passing of estimates of data symbols Xi, Yi, and Wi for different values of "i" between 1 and "k" while substituting said normalized estimate of data symbol Wi for different values of "i" between 1 and "k" for at least one of said estimates of data symbols Wi for different values of "i" between 1 and "k" in said passing;

repeating determining a new estimate for said data symbol Xi for different values of "i" between 1 and "k" based on said initial estimate and each occurrence of estimate of said data symbol Xi for different values of "i" between 1 and "k" at said decision node based on said repeated passing.

5. A method for decoding a data symbol Xi of a plurality of data symbols Xi with subscript (i) having a value from (1) to (k) and (k) being a finite number, comprising the steps of:

(a) determining a data symbol estimate for all data symbols of said plurality of data symbols Xi for different values of "i" between 1 and "k";

(b) determining a data symbol estimate for all data symbols of a plurality of data symbols Yi for different values of "i" between 1 and "k", wherein said plurality of data symbols Yi for different values of "i" between 1 and "k" are produced in a transmitter in said communication system by a first convolutional encoding of said plurality of data symbols Xi for different values of "i" between 1 and "k";

(c) determining a data symbol estimate for all data symbols of a plurality of data symbols Wi for different values of "i" between 1 and "k", wherein said plurality of data symbols Wi for different values of "i" between 1 and "k" are produced in said transmitter by interleaving said plurality of data symbols Xi, or Yi and Xi for different values of "i" between 1 and "k" to produce a plurality of data symbols Zi for different values of "i" between 1 and "k", and a second convolutional encoding of said plurality of data symbols Zi for different values of "i" between 1 and "k" to produce said plurality of data symbols Wi for different values of "i" between 1 and "k";

(d) passing said estimates of data symbols Xi and Yi for different values of "i" between 1 and "k" to a first decision node, wherein said estimates of data symbols Xi and Yi for different values of "i" between 1 and "k" passing to said first decision node include estimates for the variables Xi and Yi for different values of "i" between 1 and "k" in an equation F1 determined according to said first convolutional encoding, wherein said estimates of data symbols Yi are in terms of estimates of data symbols Xi for different values of "i" between 1 and "k" based on said first convolutional encodings, thereby producing more than one occurrences of estimate of said data symbol Xi for different values of "i" between 1 and "k" at said first decision node;

(e) passing said estimates of data symbols Wi and Zi for different values of "i" between 1 and "k" to a second decision node, wherein said estimates of data symbols Wi and Zi for different values of "i" between 1 and "k" passing to said second decision node include estimates for the variables Wi and Zi for different values of "i" between 1 and "k" in an equation F2 determined according to said second convolutional encoding, wherein estimates for said variables Zi for different values of "i" between 1 and "k" include said estimates of data symbols Xi, or Yi, or Xi and Yi for different values of "i" between 1 and "k" determined according to said interleaving, wherein said estimates of data symbols Wi and Zi are in terms of estimates of data symbols Xi for different values of "i" between 1 and "k" based on said second convolutional encodings, thereby producing more than one occurrences of estimate of said data symbol Xi for different values of "i" between 1 and "k" at said second decision node;

(f) determining, while equating said equations F1 and F2 to zero at respectively said first and second decision nodes, a new estimate for each occurrence of estimates of said data symbol Xi for different values of "i" between 1 and "k" at said first and second decision nodes;

(g) determining a new estimate for said data symbol Xi for different values of "i" between 1 and "k" based on said estimate determined at said step (a) and said new estimate determined for each occurrence of estimates of said data symbol Xi for different values of "i" between 1 and "k" at said first and second decision nodes.

6. The method as recited in claim 5 further comprising the steps of:

(h) determining a normalized estimate of data symbol Xi for different values of "i" between 1 and "k" based on said estimate determined at said step (a) and at least one of said new estimates determined for each occurrence of estimates of said data symbol Xi for different values of "i" between 1 and "k" at said first and second decision nodes;

(i) repeating said steps (d) and (e) while substituting said normalized estimate of data symbol Xi for different values of "i" between 1 and "k" for at least one of said estimates of data symbols Xi for different values of "i" between 1 and "k" in said passing.

7. The method as recited in claim 5 further comprising the steps of:

(j) determining, while equating said equations F1 and F2 to zero at respectively said first and second decision nodes, a new estimate for each occurrence of estimates of said data symbol Yi for different values of "i" between 1 and "k" at said first and second decision nodes;

(k) determining a normalized estimate of data symbol Yi for different values of "i" between 1 and "k" based on said estimate determined at said step (b) and at least one of said new estimates for each occurrence of estimates of said data symbol Yi for different values of "i" between 1 and "k" at said first and second decision nodes;

(l) repeating said steps (d) and (e) while substituting said normalized estimate of data symbol Yi for different values of "i" between 1 and "k" for at least one of said estimates of data symbols Yi for different values of "i" between 1 and "k" in said passing.

8. The method as recited in claim 5 further comprising the steps of:

(m) determining, while equating said equation F2 to zero at said second decision nodes, a new estimate for each occurrence of estimates of said data symbol Wi for different values of "i" between 1 and "k" at said second decision node;

(n) determining a normalized estimate of data symbol Wi for different values of "i" between 1 and "k" based on said estimate determined at said step (c) and at least one of said new estimates for each occurrence of estimates of said data symbol Wi for different values of "i" between 1 and "k" at said second decision node;

(o) repeating said steps (d) and (e) while substituting said normalized estimate of data symbol Wi for different values of "i" between 1 and "k" for at least one of said estimates of data symbols Wi for different values of "i" between 1 and "k" in said passing.

* * * * *